(12) United States Patent
Sandhu

US007824741B2

(10) Patent No.: US 7,824,741 B2
(45) Date of Patent: Nov. 2, 2010

(54) METHOD OF FORMING A CARBON-CONTAINING MATERIAL

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 28 days.

(21) Appl. No.: 11/848,726

(22) Filed: Aug. 31, 2007

(65) Prior Publication Data
US 2009/0061107 A1    Mar. 5, 2009

(51) Int. Cl.
*B05D 3/00* (2006.01)
(52) U.S. Cl. .................. 427/561; 427/256; 428/408
(58) Field of Classification Search ............. 427/561, 427/256; 428/408
See application file for complete search history.

(56) References Cited

U.S. PATENT DOCUMENTS

| | | | |
|---|---|---|---|
| 6,498,107 B1 | 12/2002 | Fenner | |
| 6,797,339 B2 | 9/2004 | Akizuki et al. | |
| 7,208,191 B2 | 4/2007 | Freedman | |
| 2003/0026990 A1* | 2/2003 | Yamada et al. | 428/408 |
| 2005/0163985 A1 | 7/2005 | Dorfman | |
| 2005/0271574 A1 | 12/2005 | Jang et al. | |
| 2005/0277246 A1 | 12/2005 | Kirkpatrick et al. | |
| 2006/0177594 A1 | 8/2006 | Nickel | |
| 2006/0261419 A1* | 11/2006 | Kreupl et al. | 257/401 |
| 2006/0292762 A1 | 12/2006 | Borland et al. | |
| 2007/0053168 A1 | 3/2007 | Sayir et al. | |
| 2007/0290287 A1* | 12/2007 | Freedman | 257/443 |
| 2008/0245974 A1* | 10/2008 | Kirkpatrick et al. | 250/492.21 |

FOREIGN PATENT DOCUMENTS

| | | | |
|---|---|---|---|
| FR | 2850400 | | 1/2003 |
| JP | 60-72217 | | 4/1985 |
| JP | 62-75545 | | 4/1987 |
| JP | 8-127867 | | 5/1996 |
| JP | 2003-13208 | | 1/2003 |
| JP | 2003-95627 | | 4/2003 |
| JP | 2003-96555 | | 4/2003 |
| JP | 2004043874 | | 2/2004 |
| JP | 2005-169816 | * | 6/2005 |
| JP | 2005-169816 A | | 6/2005 |
| WO | WO 026431 | | 5/2000 |
| WO | WO 01/83238 A1 | | 11/2001 |
| WO | WO 2007/002130 A2 | | 1/2007 |

OTHER PUBLICATIONS

MacCrimmon, R., et al. "Gas cluster ion beam infusion processing of semiconductors" Nuclear Instrumetns and Methods in Physics, Research B, Sep. 21, 2005 pp. 427-430.
Orlowski, Marius "CMOS Challenges of Keeping up with Moore's Law" 13th Internationl Conference on Advanced Thermal Processing of Semiconductors—RTP Oct. 4, 2005 pp. 3-21.

* cited by examiner

*Primary Examiner*—Michael Kornakov
*Assistant Examiner*—Xiao Zhao
(74) *Attorney, Agent, or Firm*—Wells St. John P.S.

(57) ABSTRACT

A method includes forming ionic clusters of carbon-containing molecules, which molecules have carbon-carbon $sp^2$ bonds, and accelerating the clusters. A surface of a substrate is irradiated with the clusters. A material is formed on the surface using the carbon from the molecules. The material includes carbon and may optionally include hydrogen. The material may include graphene. The material may form a monolayer. The molecules may include one or more material selected from the group consisting of graphene, carbon allotropes, ethylene, and hydrocarbon molecules containing ethylenic moieties. A fused region may be formed in the substrate as an interface between the substrate and the material. The clusters may have diameters of at least 20 nanometer s and may be accelerated to an energy of at least 0.5 keV.

21 Claims, No Drawings

METHOD OF FORMING A CARBON-CONTAINING MATERIAL

TECHNICAL FIELD

Methods of forming carbon-containing material using a gas cluster ion beam.

BACKGROUND

Graphene is a two dimensional arrangement of $sp^2$-bonded carbon atoms. Usually, graphene exists as individual sheets. Even so, in graphite, π bonds between graphene sheets may form sheet-to-sheet bonding. Carbon nanotubes might be considered to be graphene sheets rolled into tube shapes. Carbon nanotubes have many unique and desirable characteristics for making high-performance electronic devices. Conceptually, the direction in which a graphene sheet rolls to form a carbon nanotube controls the chirality, giving the nanotube metallic, semi-conducting, or insulating characteristics. Electrons exhibit very high mobility and zero effective mass in nanotubes and, by extension, graphene sheets.

Some have accomplished formation of graphene sheets by mechanical exfoliation, or peeling, with expected complications in control of graphene positioning and adhesion to substrates. Some have proposed graphene formed by epitaxial deposition methods on silicon substrates as potentially suitable for high performance CMOS devices. However, epitaxial deposition of graphene is expected to be complex and might not yield sufficiently low defect densities. As a result, a need exists in the art for graphene formation methods more conducive to incorporating graphene into electronic devices.

DETAILED DESCRIPTION OF THE ILLUSTRATED EMBODIMENTS

According to one embodiment, a method includes forming ionic clusters of carbon-containing molecules, which molecules have carbon-carbon sp2 bonds, and accelerating the clusters. A surface of a substrate is irradiated with the clusters. The method includes forming a material on the surface using the carbon from the molecules. The material includes carbon and may optionally include hydrogen.

By way of example, hydrogen contained in the material formed on the surface may constitute residual hydrogen from the carbon-containing molecules. However, the material formed on the surface may consist of carbon only. The material may exhibit a graphene structure. Carbon allotrope structures, such as a diamond structure, are also conceivable. Further, the material may be formed as a monolayer. If a monolayer, the material may essentially be a single graphene sheet. Some have proposed that a graphene monolayer or graphene sheet formed on a surface might have a thickness of about 8 Angstroms.

Repeating the method may accomplish growth of the material on the substrate. Growth may include addition of more monolayers. An amount of material may be formed suitable for inclusion in electronic devices, such as field effect transistors. Graphene, or other materials described herein, may be suitable for use in channel regions of field effect transistors.

A suitable substrate upon which the material may be formed includes silicon and/or silicon dioxide, including silicon dioxide formed over a bulk semiconductive wafer. The substrate surface may exhibit a mixed composition where the material is formed, or may exhibit a uniform composition. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Gas cluster ion beam (GCIB) processing (also known as GCIB infusion) involves acceleration of a large cluster of atoms or molecules to a predetermined energy followed by irradiation of a surface with the cluster. GCIB may be used to form and accelerate the ionic clusters in the embodiments herein. In GCIB, the gas phase clusters may contain many atoms or molecules, for example, at least 100 up to 10,000 or more, and are created by supersonic, adiabatic expansion, generally from a high pressure gas into a vacuum. Cooling of the gas condenses atoms or molecules into clusters. The clusters may have a size on the nano scale, for example, they may have diameters of at least 20 up to 1,000 or more nanometers. The clusters may become ionized after colliding with supplied electrons and subsequently electrostatically accelerated and focused into a useful beam. For example, the clusters may have an energy of at least 0.5 up to 500 or more kiloelectron volts (keV). Generally speaking, GCIB is known for various types of surface treatment. However, use in the context described in the various embodiments herein is not previously known.

GCIB may be referred to as an infusion method since the mechanism by which a cluster impacts a surface and interacts therewith differs significantly from the mechanism in ion implantation. Impaction of the whole cluster ion containing many atoms or molecules allows all of the matter to interact nearly simultaneously with the surface. The energy of the cluster may thus be distributed across the impaction site. The molecules in a cluster appear to stay largely intact and infuse into or onto outer portions of the surface. Understandably, variation in surface properties and cluster properties may influence the specific type of interaction. However, potential interactions include, but are not limited to, evaporation, sputtering, chemical alteration, shallow implantation, surface bonding, and deposition. Surface properties that may influence the type of interaction include atomic density, chemical stability, composition, bond energies, etc. Cluster properties that may influence the type of interaction include acceleration energy, molecule size, cluster size, composition, bond energies, etc.

Accordingly, infusion of carbon from the carbon-containing molecules into the surface may include forming a fused region in the substrate. The fused region may contain some of the carbon from the molecules as well as some of the matter from the substrate. As a result, the fused region may function as an interface between the substrate and the material formed thereon. It will be appreciated that the presence of a fused region may improve adhesion of graphene, or other materials, to the substrate, addressing one of the problems associated with known graphene-forming techniques. The fused region may exhibit a thickness of 0.5 to 5 nanometers.

Even though infusion may include subsurface interactions, where desired, cluster energy (and possibly other properties mentioned above) may be selected after consideration of surface properties to provide for infusing carbon onto the surface. Infusing carbon onto a surface, instead of into a surface, refers to an interaction with atoms at the outermost surface of a substrate somewhat like an interaction accomplishing chemisorption that occurs in atomic layer deposition. Conceivably, infusing carbon into a surface may additionally include infusing carbon onto a surface given a very large number of molecules in an ionic cluster and possible differences in energy distribution among the molecules after reaching the impaction site.

A potential molecule to include in ionic clusters of carbon-containing molecules may be graphene itself. That is, graphene may be sublimated, vaporized, or otherwise rendered gaseous using techniques such as laser ablation, evaporation, etc. and then used in GCIB to form ionic clusters of graphene-containing molecules. In a tribological method, a gaseous powder of graphene sheets may be produced by rubbing a surface of graphite. Since GCIB may largely maintain molecular structure, very large graphene molecules or sheets may be infused onto and/or into a surface. For example, the graphene molecules may contain at least 50 up to 10,000 or more carbon atoms, for example, 100 carbon atoms. The infused graphene may form a monolayer.

Graphite includes one potential source for graphene molecules. Various types of graphite exist ranging from mineral graphite to synthetic graphite and pure graphite to graphite with additives. An expectation exists that a type of graphite with the highest composition of graphene may be most suitable, although it is conceivable that experimentation may indicate otherwise.

Various allotropes of carbon exist and constitute additional possible molecules for forming ionic clusters of carbon-containing molecules. Such allotropes might be used to form a material on the surface other than graphene or, given the presence of carbon-carbon $sp^2$ bonds, might form graphene. Allotropes include diamond, fullerenes (balls, nanotubes, nano buds, etc.), aggregated diamond nanorods, glassy carbon, carbon nanofoam, and amorphous carbon (if it exhibits some carbon-carbon $sp^2$ bonding), as such allotropes are known to those of ordinary skill. More fundamentally, the carbon-containing molecules may include ethylene and/or hydrocarbon molecules containing ethylenic moieties, since such molecules provide one or more carbon-carbon $sp^2$ bonds.

Depending upon the desired material on the substrate surface, corresponding carbon-containing molecules for forming ionic clusters may be selected. For forming graphene, molecules corresponding closely in structure to graphene might provide the most suitable ionic clusters. Even so, it is conceivable that the energy distribution at the impaction site and/or chemical interactions with a substrate surface may affect chemical alterations among the molecules from the ionic cluster as well as in the substrate.

As such, carbon-carbon $sp^2$ bonds existing in the molecules may be maintained and new carbon-carbon $sp^2$ bonds may arise in the material formed on the surface. Similar considerations to those described above exist for formation of a diamond structure on the surface. Hence, the carbon-containing molecules selected for formation of ionic clusters may include one or more material selected from the group consisting of graphene, carbon allotropes, ethylene, and hydrocarbon molecules containing ethylenic moieties.

The method may further include annealing and/or crystal healing the material formed on the substrate surface in keeping with the knowledge of those of ordinary skill for reducing defect densities. Plasma treatment might be considered for removal of residual hydrogen, mentioned above, if present. Some type of post infusion processing, which may include, but is not limited to, annealing, healing, and/or plasma treatment might occur after formation of each monolayer in a desired thickness of the material or may occur after completion of the entire desired thickness.

According to another embodiment, a method includes forming ionic clusters of carbon-containing molecules, which molecules have carbon-carbon $sp^2$ bonds, and accelerating the clusters. A surface of a substrate is irradiated with the clusters and carbon is infused into the surface. The substrate contains a first material. The method includes forming a second material on the surface using the carbon from the molecules, the second material exhibiting a composition different from the first material and exhibiting a graphene structure. A fused region is formed in the substrate as an interface between the substrate and the second material. The fused region contains some of the second material.

By way of example, the second material may be formed as a monolayer. Also, the molecules may include one or more material selected from the group consisting of graphene, carbon allotropes, ethylene, and hydrocarbon molecules containing ethylenic moieties. Other process conditions and/or properties of matter described above for the preceding embodiments may be incorporated into the present embodiment.

According to a further embodiment, a method includes forming carbon-containing ionic clusters having carbon-carbon sp bonds and diameters of at least 20 up to 1,000 or more nanometers and accelerating the clusters to an energy of at least 0.5 up to 500 or more keV. The method includes irradiating a surface of a substrate with the clusters and infusing carbon onto the surface. A monolayer of material is formed on the surface using the carbon from the clusters. The material consists of carbon and, optionally, hydrogen and exhibits a graphene structure.

By way of example, the method may further include infusing carbon into the surface and forming a fused region in the substrate as an interface between the substrate and the material. The fused region may contain some of the material. Other process conditions and/or properties of matter described above for the preceding embodiments may be incorporated into the present embodiment.

The field effect transistors or other devices incorporating the materials formed by the methods herein may be included in memory cells or logic circuits or chips. Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method comprising:
   providing a gas phase including carbon-containing molecules;
   supersonically and adiabatically expanding the gas phase, forming ionic clusters of the carbon-containing molecules, wherein the molecules have carbon-carbon $sp^2$ bonds and comprises one or more materials selected from the group consisting of graphene, carbon allotropes, ethylene, and hydrocarbon molecules containing ethylenic moieties;

accelerating the clusters;

irradiating a surface of a substrate with the accelerated clusters;

forming a material on the surface using the carbon from the molecules in the accelerated clusters, the material consisting of carbon and, optionally, hydrogen; and forming an electronic device having an electric circuit and containing at least a portion of the material in the electric circuit.

2. The method of claim 1 wherein the clusters contain at least 100 of the molecules.

3. The method of claim 1 wherein the clusters have diameters of at least 20 nanometers.

4. The method of claim 1 wherein the clusters are accelerated to an energy of at least 0.5 keV.

5. The method of claim 1 wherein the substrate comprises silicon and/or silicon dioxide.

6. The method of claim 1 wherein the material exhibits a graphene or diamond structure.

7. The method of claim 1 wherein the material is formed as a monolayer.

8. The method of claim 1 further comprising, due to the irradiating, infusing carbon into the surface and forming a fused region in the substrate as an interface between the substrate and the material, the fused region containing some of the material.

9. The method of claim 1 further comprising annealing and/or crystal healing the material.

10. A method comprising:

providing a gas phase including carbon-containing molecules;

condensing the gas phase into ionic clusters of the carbon-containing molecules, which molecules have carbon-carbon $sp^2$ bonds, and accelerating the clusters;

irradiating a surface of a substrate with the accelerated clusters and infusing carbon into the surface, the substrate containing a first material;

forming a second material on the surface using the carbon from the molecules in the accelerated clusters, the second material exhibiting a composition different from the first material and exhibiting a graphene structure;

forming a fused region in the substrate as an interface between the substrate and the second material, the fused region containing some of the second material; and forming a field effect transistor containing at least a portion of the second material in its channel region.

11. The method of claim 10 wherein the molecules comprise one or more material selected from the group consisting of graphene, carbon allotropes, ethylene, and hydrocarbon molecules containing ethylenic moieties.

12. The method of claim 10 wherein the clusters contain at least 100 of the molecules.

13. The method of claim 10 wherein the clusters have diameters of at least 20 nm.

14. The method of claim 10 wherein the clusters are accelerated to an energy of at least 0.5 keV.

15. The method of claim 10 wherein the substrate comprises a bulk semiconductive wafer.

16. The method of claim 10 wherein the second material is formed as a monolayer.

17. The method of claim 10 wherein the fused region exhibits a thickness of 0.5 to 5 nm.

18. A method comprising:

forming graphene-containing ionic clusters having carbon-carbon $sp^2$ bonds and diameters of at least 20 nm;

accelerating the clusters to an energy of at least 0.5 keV;

irradiating a surface of a substrate with the clusters and infusing graphene onto the surface;

forming a monolayer of a material on the surface using the graphene from the clusters, the material consisting of carbon and, optionally, hydrogen and exhibiting a graphene structure; and due to the irradiating, infusing graphene into the surface and forming a fused region in the substrate as an interface between the substrate and the material, the fused region containing some of the material.

19. The method of claim 18 wherein the molecules comprise one or more material selected from the group consisting of graphene, carbon allotropes, ethylene, and hydrocarbon molecules containing ethylenic moieties.

20. The method of claim 18 wherein the clusters contain at least 100 of the molecules.

21. The method of claim 18 further comprising forming a memory cell having a field effect transistor containing at least a portion of the material in its channel region.

* * * * *

UNITED STATES PATENT AND TRADEMARK OFFICE
CERTIFICATE OF CORRECTION

| | | |
|---|---|---|
| PATENT NO. | : 7,824,741 B2 | Page 1 of 1 |
| APPLICATION NO. | : 11/848726 | |
| DATED | : November 2, 2010 | |
| INVENTOR(S) | : Gurtej S. Sandhu | |

It is certified that error appears in the above-identified patent and that said Letters Patent is hereby corrected as shown below:

On the first page, in field (56), in column 2, under "Other Publications", line 2, delete "Instrumetns" and insert -- Instruments --, therefor.

On the first page, in field (56), in column 2, under "Other Publications", line 5, delete "Internationl" and insert -- International --, therefor.

On the first page, in field (57), in column 2, in "Abstract", line 13, delete "nanometer s" and insert -- nanometers --, therefor.

Signed and Sealed this
Fourth Day of January, 2011

David J. Kappos
*Director of the United States Patent and Trademark Office*